US006184123B1

United States Patent
Ge et al.

(10) Patent No.: US 6,184,123 B1
(45) Date of Patent: Feb. 6, 2001

(54) METHOD TO PREVENT DELAMINATION OF SPIN-ON-GLASS AND PLASMA NITRIDE LAYERS USING ION IMPLANTATION

(75) Inventors: Chun-Hu Ge, Taipei; Liang Szuma, Hsin-Chu; Chih-Ming Chen, Tao-Yuan, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/365,982

(22) Filed: Aug. 2, 1999

(51) Int. Cl.[7] ................................................. H01L 21/4763
(52) U.S. Cl. ..................... 438/624; 438/637; 438/782; 438/766
(58) Field of Search ..................... 438/624, 637, 438/761, 763, 766, 782, 787, 791

(56) References Cited

U.S. PATENT DOCUMENTS

| | | | |
|---|---|---|---|
| 4,849,248 | * 7/1989 | Hashimoto | 427/38 |
| 5,192,697 | 3/1993 | Leong | 437/37 |
| 5,336,640 | * 8/1994 | Sato | 438/763 |
| 5,366,850 | * 11/1994 | Chen et al. | 430/314 |
| 5,413,953 | 5/1995 | Chien et al. | 437/69 |
| 5,429,990 | 7/1995 | Liu et al. | 437/190 |
| 5,459,086 | 10/1995 | Yang | 437/35 |
| 5,496,776 | * 3/1996 | Chien et al. | 438/624 |
| 5,554,567 | * 9/1996 | Wang | 438/624 |
| 5,556,806 | * 9/1996 | Pan et al. | 438/624 |
| 5,602,056 | * 2/1997 | Jain et al. | 438/586 |
| 5,665,657 | * 9/1997 | Lee | 438/624 |
| 5,716,872 | * 2/1998 | Isobe | 438/624 |
| 5,716,890 | * 2/1998 | Yao | 438/624 |
| 5,723,380 | * 3/1998 | Wang et al. | 438/624 |
| 5,792,702 | * 8/1998 | Liang | 438/624 |
| 5,795,821 | * 8/1998 | Bacchetta et al. | 438/624 |
| 5,804,498 | * 9/1998 | Jang et al. | 438/624 |
| 5,851,603 | * 12/1998 | Tsai et al. | 427/579 |

(List continued on next page.)

OTHER PUBLICATIONS

Berti et al., "Manufacturing Advancements in an Organic SOG Process by Ar[+] Implantation", 1996 IEEE/SEMI Advanced Semiconductor Manufacturing Conference pp. 259–264.

Moriya et al. "Modification Effects in Ion–Implanted SiOz Spin–On–Glass", The Journal of the Electrochemical Society, vol. 140, No. 5, May 1993, pp. 1442–1449.

Mukkavilli et al., "Plasma Processes for Thin Film Surface Treatment", Proceedings of the IEEE Electronic Component and Technology Conference, 1990, 40th,, vol. 1, pp. 737–745.

Primary Examiner—John F. Niebling
Assistant Examiner—Lynne A. Gurley
(74) Attorney, Agent, or Firm—George O. Saile; Stephen B. Ackerman; Rosemary L. S. Pike

(57) ABSTRACT

A method of forming an integrated circuit device using ion implantation to improve the adhesion of plasma nitride to spin-on-glass is achieved. Semiconductor device structures are provided in and on a substrate where conductive connections are planned between the device structures and planned conductive traces overlying a planned interlevel dielectric layer. An insulating oxide layer is deposited overlying the device structures. A spin-on-glass layer is coated overlying the insulating oxide layer. The spin-on-glass layer is dried. The spin-on-glass layer is ion implanted to form an amorphous, silicon rich, adhesion layer at the top surface of the spin-on-glass layer. The spin-on-glass layer is cured. A first plasma-enhanced silicon nitride layer deposited overlying the adhesion layer of the spin-on-glass and completing the interlevel dielectric layer. Via openings are etched through to the top surfaces of the semiconductor device. A conductive layer is deposited to fill the via openings and is etched to form the conductive traces. A second plasma-enhanced silicon nitride layer is deposited to complete the integrated circuit.

20 Claims, 3 Drawing Sheets

U.S. PATENT DOCUMENTS

| | | | |
|---|---|---|---|
| 5,855,962 * | 1/1999 | Cote et al. | 427/376.2 |
| 5,861,345 * | 1/1999 | Chou et al. | 438/763 |
| 5,866,476 * | 2/1999 | Choi et al. | 438/624 |
| 5,869,388 * | 2/1999 | Chan et al. | 438/782 |
| 5,872,064 * | 2/1999 | Huff et al. | 438/624 |
| 5,872,066 * | 2/1999 | Fang et al. | 438/787 |
| 5,877,080 * | 3/1999 | Aoi et al. | 438/622 |
| 5,989,983 * | 11/1999 | Goo et al. | 438/782 |
| 6,001,745 * | 12/1999 | Tu et al. | 438/782 |
| 6,001,747 * | 12/1999 | Annapragada | 438/624 |
| 6,027,996 * | 2/2000 | Wu et al. | 438/624 |
| 6,046,101 * | 4/2000 | Dass et al. | 438/624 |

* cited by examiner

METHOD TO PREVENT DELAMINATION OF SPIN-ON-GLASS AND PLASMA NITRIDE LAYERS USING ION IMPLANTATION

BACKGROUND OF THE INVENTION (1) Field of the Invention

The invention relates to a method of fabricating semiconductor structures, and more particularly, to the formation of an interlevel dielectric comprised of a spin-on-glass and a plasma-enhanced silicon nitride stack.

(2) Description of the Prior Art

Spin-on-glass (SOG) is a material commonly used in the manufacture of integrated circuits as a dielectric or insulating layer. The advantage of SOG over other forms of dielectric material, such as low-pressure chemical vapor deposited silicon oxide (CVD), is that SOG can reliably fill and planarize even very difficult wafer surface topologies.

SOG is essentially a form of silicon oxide that is suspended in a solution of solvent. Typically, SOG is made from a silicate or a polysiloxane material dissolved in a combination of a low boiling point solvent, such as methanol, and a high boiling point solvent, such as butyl cellosolve. SOG is applied by dispensing a small amount of the solution onto a wafer that is spinning. Most of the solvent, or vehicle, is then driven off the wafer surface during a low-temperature drying step that is usually called the bake step. The process of coating and drying SOG layers may then be repeated until a sufficient amount of material has been built up to achieve the coverage and planarization desired. Once the layer of SOG is built up, a curing step is performed. During the curing step, the SOG is subjected to a high temperature environment to breakdown the silicate or the polysiloxane material to form a more nearly silicon dioxide material.

Once the SOG layer is formed, it is typical in the art to cover the SOG with a capping layer such as silicon oxide or silicon nitride before depositing conductive layers such as aluminum. It is the specific case of using plasma-enhanced silicon nitride as a capping layer for SOG that this invention is seeking to improve.

Referring to FIG. 1, a partially-completed prior art integrated circuit is shown in cross-section. A layer of thick field oxide 14 has been formed overlying a substrate 10. Two conductive traces 18 are shown defined overlying the field oxide layer 14. A layer of insulating oxide 22 has been deposited overlying the conductors. A thick layer of spin-on-glass 26 is shown overlying the insulating layer 22. The SOG layer has been formed using the process of coating, drying, and curing outlined above. Finally, a layer of plasma-enhanced silicon nitride, or simply plasma nitride, 30, has been deposited overlying the SOG layer 26. Plasma nitride is commonly used as an insulating dielectric in integrated circuit manufacturing because it can be deposited with low pinhole density, has good mechanical properties, and a high dielectric constant when compared to silicon oxide.

A problem that occurs in the conventional art is also shown in FIG. 1. Poor layer to layer adhesion between plasma nitride 30 and SOG 26 can cause delamination 35 to occur. Subsequent processing steps, such as polyimide coating and curing and even certain assembly processes can cause this delamination 35 that, in turn, can cause a reduction in wafer yield or an increase in reliability problems.

There are several prior art references to the effects of ion implantation into spin-on-glass and other thin film materials.

In "Manufacturing Advancements in an Organic Process by $Ar^+$ Implantation," by Berti and Farina, 1996 IEEE/SEMI Advanced Semiconductor Manufacturing Conference, pp. 259–264, argon ion implantation into SOG is shown to break Si—$CH_3$ bonds leaving only Si—OH bonds. The density of the SOG material is increased and the absorption and outgassing effects in SOG are reduced. The article "Modification Effects in Ion-Implanted $SiO_2$ Spin-On-Glass," by Moriya, Diamond, and Kalish, in The Journal of the Electrochemical Society, Vol. 140, No. 5, May 1993, pp. 1442–1449, describes material volume shrinkage and a greater than 50% reduction in HF etch rate of $SiO_2$-based SOG when implanted with either silicon or phosphorous. In "Plasma Processes for Thin Film Surface Treatment," by Mukkavilla, Pasco, Farooq, and Griffin, in the Proceedings of the IEEE Electronic Component and Technology Conference, 1990, $40^{th}$, Vol. 1, pp. 737–745, modification of polyimide surface characteristics, such as wetting and adhesion, is seen due to ion implantation.

Several other prior art approaches attempt to improve the performance of SOG by ion implantation., U.S. Pat. No. 5,459,086 to Yang teaches a process to eliminate outgassing from the SOG layer. An ion implantation is performed at a large tilt angle through the via opening to prevent via poisoning from the SOG layer. U.S. Pat. No. 5,496,776 to Chien et al teaches a method to implant ions into a spin-on-glass layer sufficient to cause structural changes in the complete depth of the cured material and to cause the material to become moisture sorption and outgassing resistant. U.S. Pat. No. 5,413,953 to Chien et al discloses a process to planarize an oxide layer using an ion implant and etch back sequence where spin-on-glass is used as a sacrificial implant layer. U.S. Pat. No. 5,192,697 to Leong discloses a method to cure SOG using ion implantation of argon to cause material heating. U.S. Pat. No. 5,429,990 to Liu et al teaches a method to improve planarity and to eliminate via poisoning in spin-on-glass by ion implanting through the complete thickness of the SOG layer after curing.

SUMMARY OF THE INVENTION

A principal object of the present invention is to provide an effective and very manufacturable method of fabricating the interlevel dielectric in the manufacture of integrated circuits.

A further object of the present invention is to provide a method to prevent the delamination of the layer stack of plasma-enhanced silicon nitride overlying spin-on-glass that makes up the interlevel dielectric.

A still further object of the present invention is to provide a method to prevent the delamination of the layer stack by ion implantation of the spin-on-glass before depositing the silicon nitride layer.

In accordance with the objects of this invention, a new method of fabricating the interlevel dielectric has been achieved. An ion implantation is performed on the spin-on-glass layer before the deposition of the plasma-enhanced silicon nitride layer to improve the layer-to-layer adhesion and thereby eliminate delamination. Field oxide isolation regions are provided overlying a semiconductor substrate to isolate active device regions. Conductive traces are provided overlying the substrate. An insulating oxide layer is deposited overlying the conductive traces. A thick layer of spin-on-glass is coated overlying the insulating oxide layer. The spin-on-glass layer is low-temperature baked. An ion implantation is performed to form an amorphous, silicon-rich, adhesion layer at the surface of the spin-on-glass layer.

The spin-on-glass is then high-temperature cured. A first plasma-enhanced silicon nitride layer is deposited overlying the spin-on-glass layer to complete the interlevel dielectric. Via openings are etched to expose the top surfaces of the conductive traces. A conductive layer is deposited overlying the plasma-enhanced silicon nitride layer and filling the via openings. The conductive layer is etched to define connective features. A second plasma-enhanced silicon nitride layer is deposited as a passivation layer, and the integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 1:
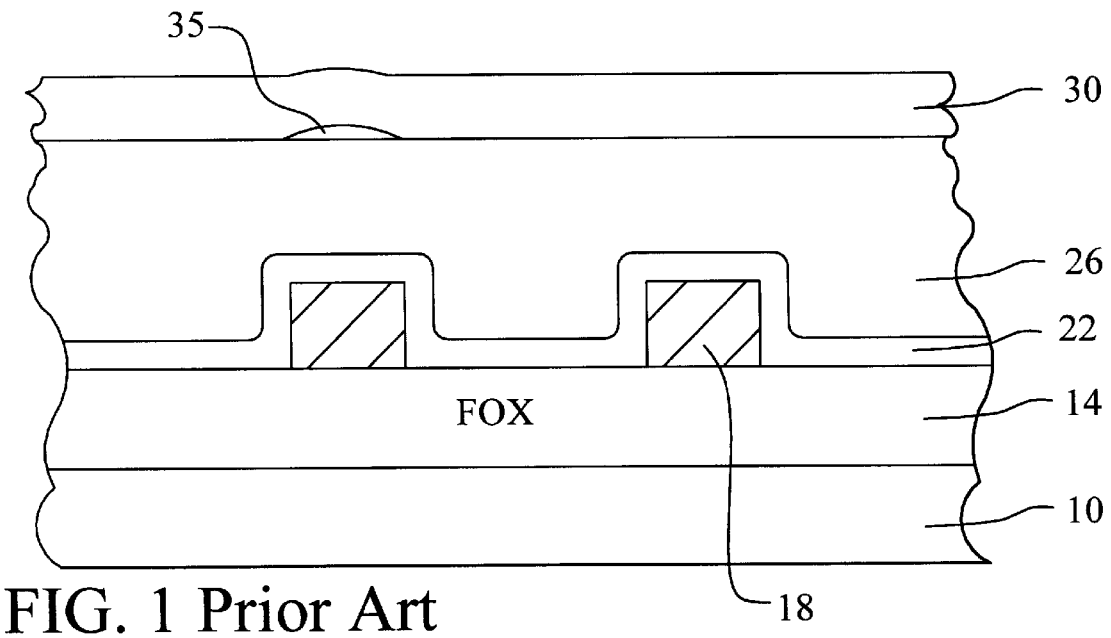
FIG. 1 schematically illustrates in cross-section a partially completed prior art integrated circuit device showing a delamination of the plasma-enhanced silicon nitride from the spin-on-glass layer.
Figure 2:
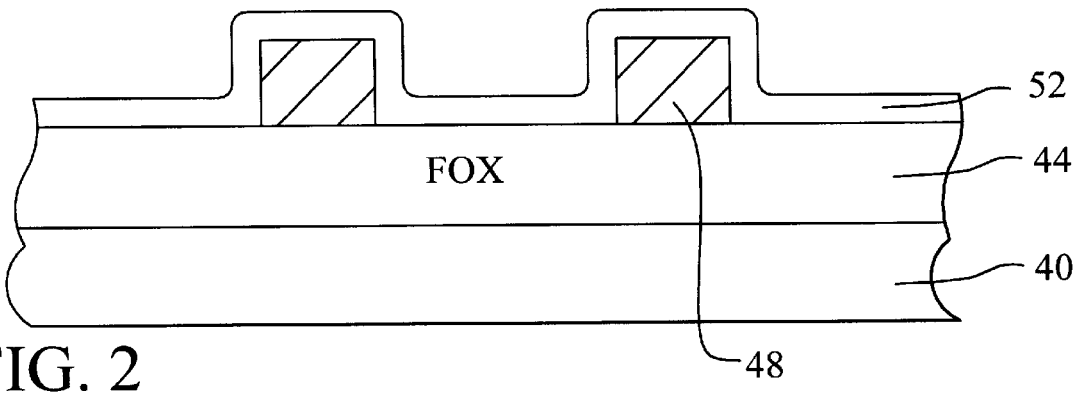
FIGS. 2 through 7 schematically illustrate in cross-sectional representation a preferred embodiment of the present invention.

Referring now more particularly to FIG. 2, there is illustrated a cross section of a partially completed integrated circuit device. Semiconductor substrate 40 is preferably composed of monocrystalline silicon. A field oxide isolation layer 44 is conventionally grown on the surface of the substrate in areas defined by a masking operation that is not shown. Conductive traces 48 have been formed overlying the field oxide layer 44. The traces could be composed of polysilicon or of a conductive metal such as aluminum or copper. In the preferred embodiment of the present invention, an interlevel dielectric is fabricated wherein vias are etched and conductive connections are made between conductive traces above and below the interlevel dielectric. It should be clear to those skilled in the art, however, that the present invention applies to any application where an interlevel dielectric layer is comprised of a plasma-enhanced silicon nitride layer deposited overlying a spin-on-glass layer.

A thin insulator oxide layer 52 is conventionally deposited overlying the conductive traces 48 and the field oxide layer 44. This insulator oxide is formed preferably by plasma-enhanced chemical vapor deposition (PE-CVD).

Figure 3:
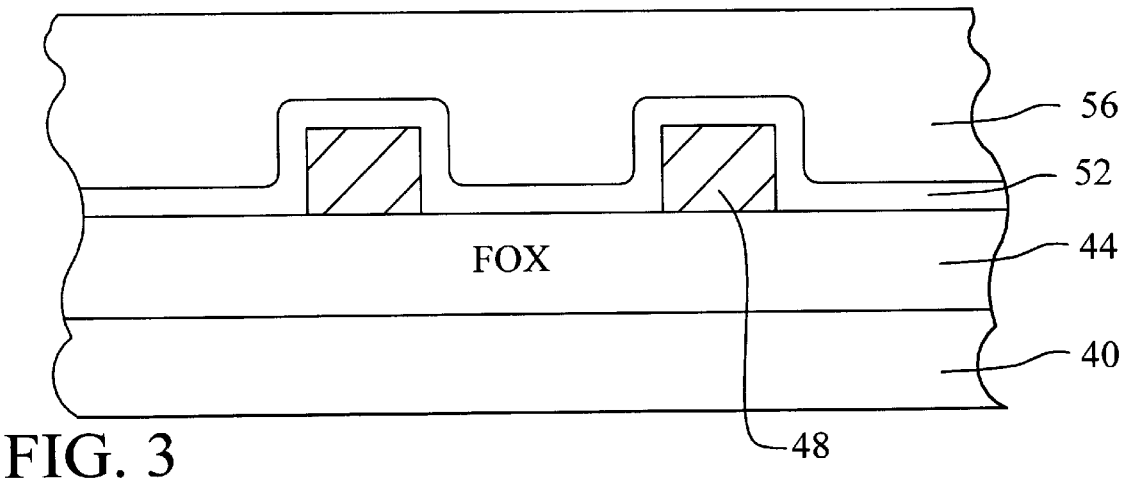

Referring now to FIG. 3, a spin-on-glass (SOG) layer is coated overlying the insulator oxide layer. The process of building up the spin-on-glass layer is typical to the art. The SOG may be made from a silicate or a polysiloxane material dissolved in a solvent. The SOG is applied by dispensing a small amount of the solution onto a wafer that is spinning. Most of the solvent, or vehicle, is then driven off the wafer surface during a low-temperature drying step that is usually called the bake step. The process of coating and drying SOG layers may then be repeated until a sufficient amount of material has been built up to achieve the coverage and planarization desired. In the preferred embodiment, the spin-on-glass layer is deposited to a thickness of between about 2,000 Angstroms and 4,000 Angstroms. In the drying or baking process for the preferred embodiment, the SOG coated semiconductor wafers are indexed to successive hot plates of about 800 degrees C. for about 1 minutes, about 150 degrees C. for about 3 minutes, and about 200 degrees C. for about 2 minutes.

Figure 4:
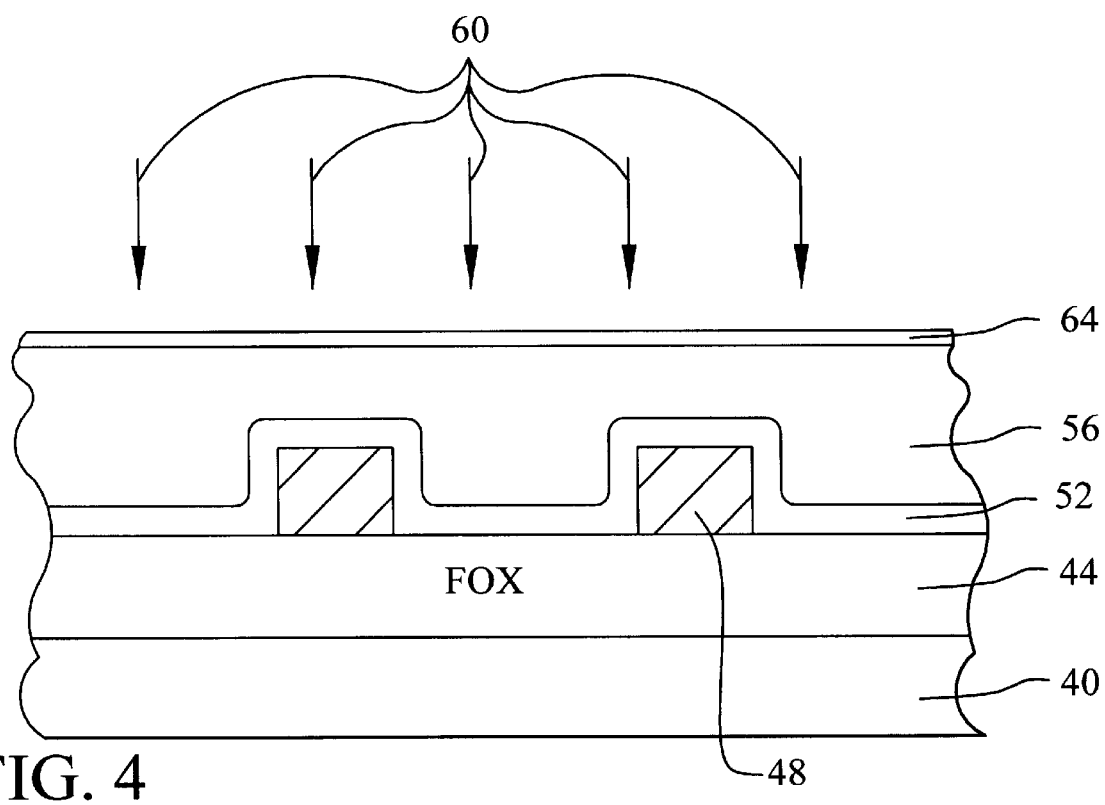

Referring now to FIG. 4 an important part of the present invention is described. After the spin-on-glass layer 56 is baked, an ion implantation 60 is performed. The purpose of the ion implantation is to improve the surface adhesion of the SOG material. The implantation may be with silicon, boron, arsenic, or phosphorous. In the preferred embodiment, silicon is implanted at a dose concentration of between about $1.0 \times 10^3$ atoms/cm$^3$ and $1.0 \times 10^5$ atoms/cm$^3$ and an implant energy of between about 50 KeV and 250 KeV. The silicon-rich amorphous layer will form regardless which implant species is used.

The ion implantation 60 breaks Si—CH$_3$ bonds in the SOG layer 56. The undesirable CH3 components are then harmlessly outgassed during the subsequent SOG curing process. The implantation step forms an amorphous, silicon rich, adhesion layer 64 at the surface of the SOG. The adhesion layer 64 has a depth of between about 1,000 Angstroms and 2,000 Angstroms. The adhesion of the SOG surface is improved such that, when the plasma-enhanced silicon nitride layer is deposited, delamination is eliminated.

Following the ion implantation, a curing step is performed. During the curing step, the SOG layer is subjected to a high temperature environment to breakdown either the silicate or the polysiloxane material to silicon dioxide. In the preferred embodiment, the curing process is performed at between about 400 degrees C. and 450 degrees C. for between about 20 minutes and 40 minutes.

Figure 5:
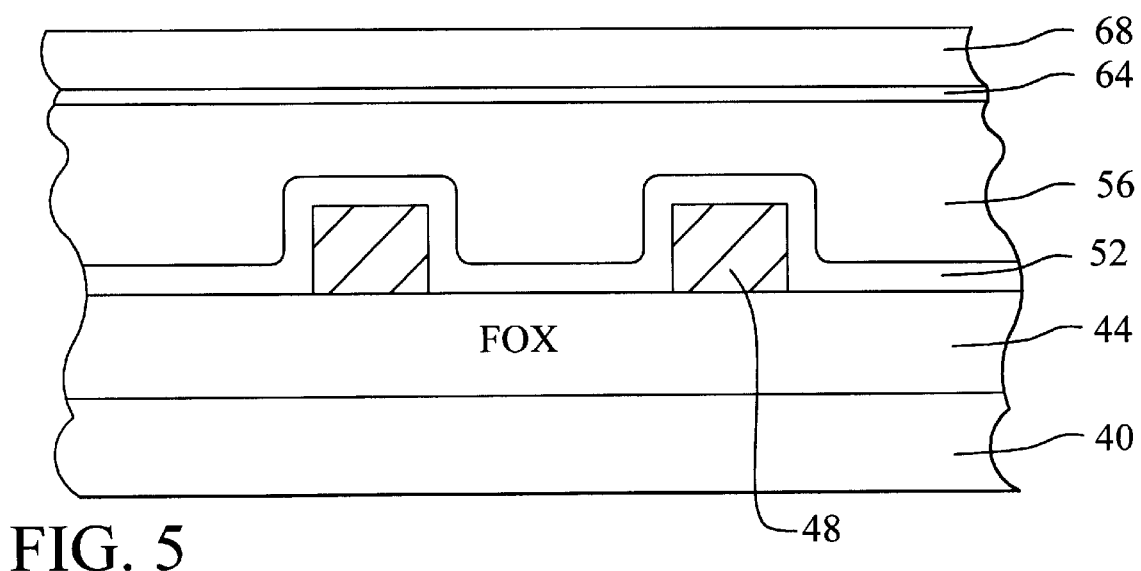

Referring now to FIG. 5, a first plasma-enhanced silicon nitride layer 68 is deposited overlying the SOC adhesion layer 64. The first plasma-enhanced silicon nitride layer is conventionally deposited using a CVD process to a preferred thickness of between about 7,000 Angstroms and 13,000 Angstroms.

Figure 6:
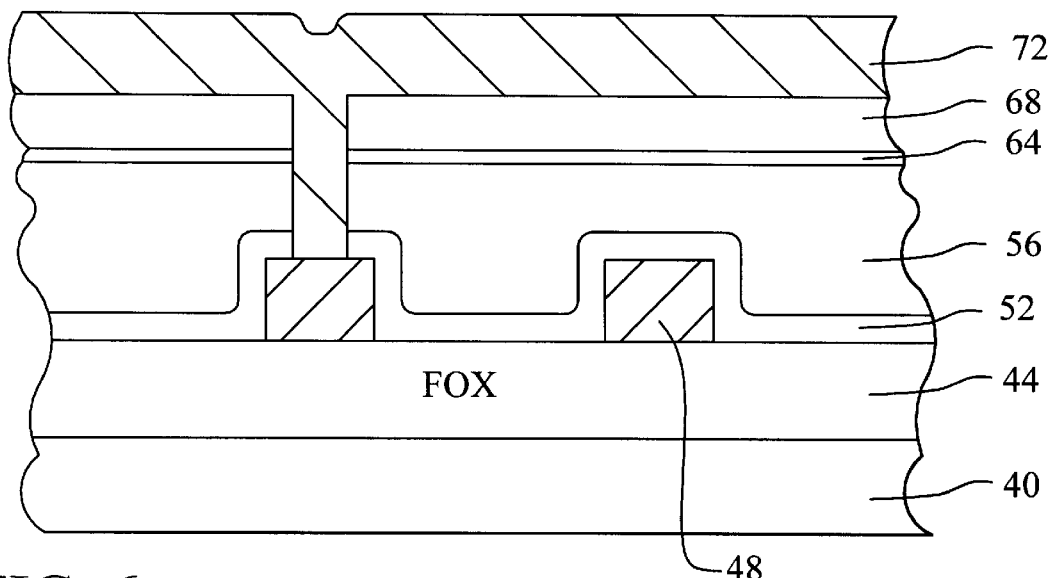

Referring to FIG. 6, via openings are etched through the first plasma nitride layer 68, the SOG adhesion layer 64, the SOG layer 56, and the insulating layer 52. The vias are made preferably using reactive ion etching (RIE) with conventional chemistries. A conductive layer 72 is then deposited overlying the plasma-nitride 68 and filling the via openings. The conductive layer may be polysilicon or a conductive metal such as aluminum or copper.

Figure 7:
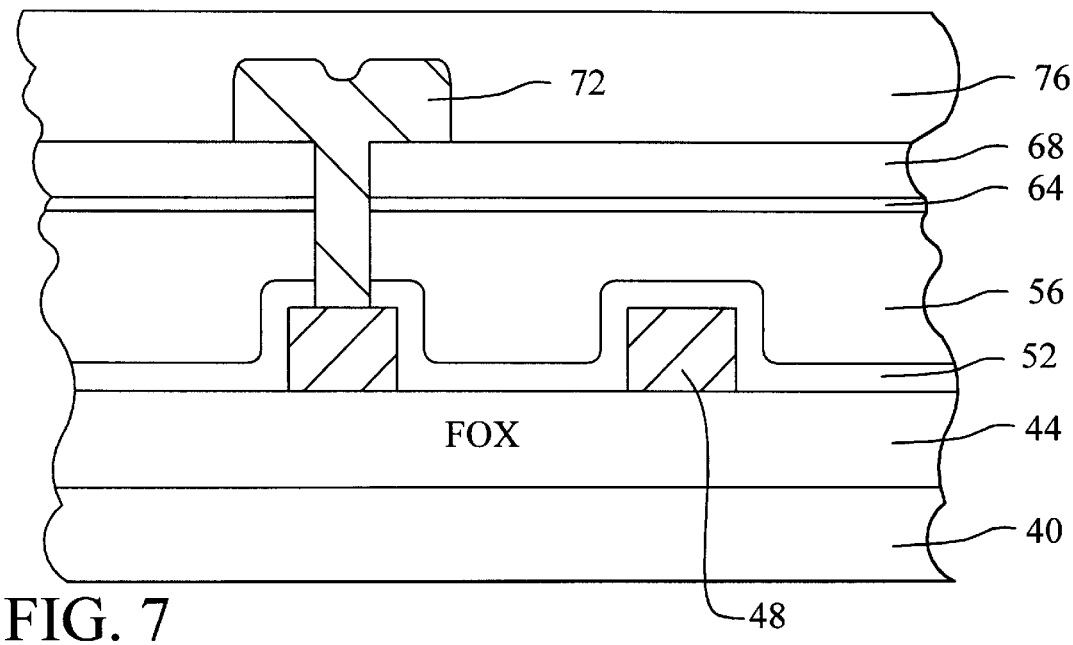

FIG. 7 shows the final process steps. The conductive layer 72 is etched as defined by a photolithographic mask, not shown, to define useful connective features. A second plasma-enhanced silicon nitride layer 76 is then deposited as a passivation layer overlying the conductive layer 72 to complete the integrated circuit device.

Because of the improved adhesion of the SOG adhesion layer 64, delamination of the first plasma nitride layer 68 from the spin-on-glass layer 56 does not occur, even during subsequent high-temperature processing or assembly steps. The present invention provides this benefit using a novel implantation before cure scheme that does not add additional masking or deposition steps.

The present invention is a unique process whereby a silicon ion implantation is performed prior to SOG curing. A silicon rich amorphous layer is formed. If ion implantation were performed after curing, only a treated surface would result. In addition, the unique process improves adhesion specifically between SOG and nitride films. Finally, the silicon implant specifically breaks CH$_3$—Si bonds in the SOG material. This not only allows the silicon rich amorphous layer to be formed, but also compensates stress within the SOG layer to prevent layer delamination.

The process of the present invention provides a very manufacturable process for fabricating the interlevel dielectric in the manufacture of integrated circuits.

While the invention has been particularly shown and described with reference to the preferred embodiments thereof, it will be understood by those skilled in the art that various changes in form and details may be made without departing from the spirit and scope of the invention.

What is claimed is:

1. A method of forming an integrated circuit device comprising:

providing semiconductor device structures in and on a semiconductor substrate wherein conductive connections are planned between said device structures and planned conductive traces overlying a planned interlevel dielectric layer;

depositing an insulating oxide layer overlying said device structures;

coating a spin-on-glass layer overlying said insulating oxide layer;

drying said spin-on-glass layer;

ion implanting said spin-on-glass layer to form an amorphous, silicon rich, adhesion layer at the top surface of said spin-on-glass layer;

curing said spin-on-glass layer;

depositing a first plasma-enhanced silicon nitride layer overlying said adhesion layer of said spin-on-glass and thereby completing said interlevel dielectric layer; and completing said integrated circuit device.

2. The method according to claim 1 wherein said spin-on-glass layer is comprised of one of the group of: polysiloxane-based spin-on-glass and silicate-based spin-on-glass.

3. The method according to claim 1 wherein said coating of said spin-on-glass layer coats to a thickness of between about 2,000 Angstroms and 4,000 Angstroms.

4. The method according to claim 1 wherein said step of drying said spin-on-glass layer is performed at successive hot plates of about 80 degrees C. for about 1 minutes, about 150 degrees C. for about 3 minutes, and about 200 degrees C. for about 2 minutes.

5. The method according to claim 1 wherein said step of ion implanting of said spin-on-glass layer uses an ion from the group composed of: silicon, boron, arsenic, and phosphorous.

6. The method according to claim 1 wherein said step of ion implanting is performed at a dose concentration of between about $1.0 \times 10^3$ atoms/cm$^3$ and $1.0 \times 10^5$ atoms/cm$^3$ and an implant energy of between about 50 KeV and 250 KeV.

7. The method according to claim 1 wherein said amorphous, silicon rich, adhesion layer is formed at said top surface of said spin-on-glass layer to a depth of between about 1,000 Angstroms and 2,000 Angstroms.

8. The method according to claim 1 wherein said step of curing said spin-on-glass layer is performed at between about 400 degrees C. and 450 degrees C. for between about 20 minutes and 40 minutes.

9. The method according to claim 1 wherein said first plasma-enhanced silicon nitride layer is deposited to a thickness of between about 7,000 Angstroms and 13,000 Angstroms.

10. A method of forming an integrated circuit device comprising:

providing semiconductor device structures in and on a semiconductor substrate wherein conductive connections are planned between said device structures and planned conductive traces overlying a planned interlevel dielectric layer;

depositing an insulating oxide layer overlying said device structures;

coating a spin-on-glass layer overlying said insulating oxide layer wherein said spin-on-glass is one of a group composed of: polysiloxane-based and silicate-based compounds;

drying said spin-on-glass layer;

ion implanting said spin-on-glass layer with silicon ions to form an amorphous, silicon rich, adhesion layer at the top surface of said spin-on-glass layer wherein said adhesion layer is formed to a depth of between about 1,000 Angstroms and 2,000 Angstroms;

curing said spin-on-glass layer;

depositing a first plasma-enhanced silicon nitride layer overlying said adhesion layer of said spin-on-glass and thereby completing said interlevel dielectric layer;

etching through said first plasma-enhanced silicon nitride layer, said adhesion layer, said spin-on-glass layer, and said insulating oxide layer to the top surfaces of said semiconductor device structures where defined by a photolithographic mask and thereby forming via openings;

depositing a conductive layer overlying said first plasma-enhanced silicon nitride layer and filling said via openings and thereby forming said conductive connections;

etching said conductive layer where defined by photolithographic mask and thereby forming said conductive traces;

depositing a second plasma-enhanced silicon nitride layer overlying said conductive traces and said first plasma-enhanced silicon nitride layer; and completing said integrated circuit device.

11. The method according to claim 10 wherein said coating of said spin-on-glass layer coats to a thickness of between about 2,000 Angstroms and 4,000 Angstroms.

12. The method according to claim 10 wherein said step of drying said spin-on-glass layer is performed at successive hot plates of about 80 degrees C. for about 1 minutes, about 150 degrees C. for about 3 minutes, and about 200 degrees C. for about 2 minutes.

13. The method according to claim 10 wherein said step of ion implanting is performed at a dose concentration of between about $1.0 \times 10^3$ atoms/cm$^3$ and $1.0 \times 10^5$ atoms/cm$^3$ and an implant energy of between about 50 KeV and 250 KeV.

14. The method according to claim 10 wherein said step of curing said spin-on-glass layer is performed at between about 400 degrees C. and 450 degrees C. for between about 20 minutes and 40 minutes.

15. The method according to claim 10 wherein said first plasma-enhanced silicon nitride layer is deposited to a thickness of between about 7,000 Angstroms and 13,000 Angstroms.

16. A method of forming an integrated circuit device comprising:

providing semiconductor device structures in and on a semiconductor substrate wherein conductive connections are planned between said device structures and planned conductive traces overlying a planned interlevel dielectric layer;

depositing an insulating oxide layer overlying said device structures;

coating a spin-on-glass layer overlying said insulating oxide layer wherein said spin-on-glass is one of a group composed of: polysiloxane-based and silicate-based compounds;

drying said spin-on-glass layer;

ion implanting said spin-on-glass layer with silicon ions to form an amorphous, silicon rich, adhesion layer at the top surface of said spin-on-glass layer wherein said adhesion layer is formed to a depth of between about 2,000 Angstroms and 3,000 Angstroms and wherein said ion implanting is performed at a dose concentration of between about $1.0 \times 10^3$ atoms/cm$^3$ and $1.0 \times 10^5$ atoms/cm$^3$ and an implant energy of between about 50 KeV and 250 KeV;

curing said spin-on-glass layer;

depositing a first plasma-enhanced silicon nitride layer overlying said adhesion layer of said spin-on-glass and thereby completing said interlevel dielectric layer;

etching through said first plasma-enhanced silicon nitride layer, said adhesion layer, said spin-on-glass layer, and said insulating oxide layer to the top surfaces of said semiconductor device structures where defined by a photolithographic mask and thereby forming via openings;

depositing a conductive layer overlying said first plasma-enhanced silicon nitride layer and filling said via openings and thereby forming said conductive connections;

etching said conductive layer where defined by photolithographic mask and thereby forming said conductive traces;

depositing a second plasma-enhanced silicon nitride layer overlying said conductive traces and said first plasma-enhanced silicon nitride layer; and completing said integrated circuit devices.

17. The method according to claim 16 wherein said coating of said spin-on-glass layer coats to a thickness of between about 2,000 Angstroms and 4,000 Angstroms.

18. The method according to claim 16 wherein said step of drying said spin-on-glass layer is performed at successive hot plates of about 80 degrees C. for about 1 minutes, about 150 degrees C. for about 3 minutes, and about 200 degrees C. for about 2 minutes.

19. The method according to claim 16 wherein said step of curing said spin-on-glass layer is performed at between about 400 degrees C. and 450 degrees C. for between about 20 minutes and 40 minutes.

20. The method according to claim 16 wherein said first plasma-enhanced silicon nitride layer is deposited to a thickness of between about 7,000 Angstroms and 13,000 Angstroms.

* * * * *